(12) United States Patent
Wischnewskiy et al.

(10) Patent No.: US 10,432,112 B2
(45) Date of Patent: Oct. 1, 2019

(54) ULTRASONIC MOTOR

(71) Applicant: PHYSIK INSTRUMENTE (PI) GMBH &. CO. KG, Karlsruhe (DE)

(72) Inventors: Wladimir Wischnewskiy, Rathenow (DE); Alexej Wischnewski, Wörth (DE)

(73) Assignee: PHYSIK INSTRUMENTE (PI) GMBH &. CO. KG, Karlsruhe (DE)

( * ) Notice: Subject to any disclaimer, the term of this patent is extended or adjusted under 35 U.S.C. 154(b) by 465 days.

(21) Appl. No.: 15/327,846

(22) PCT Filed: Jul. 21, 2015

(86) PCT No.: PCT/DE2015/200409
§ 371 (c)(1),
(2) Date: Jan. 20, 2017

(87) PCT Pub. No.: WO2016/012020
PCT Pub. Date: Jan. 28, 2016

(65) Prior Publication Data
US 2017/0214339 A1    Jul. 27, 2017

(30) Foreign Application Priority Data

Jul. 23, 2014 (DE) .......................... 10 2014 214 357

(51) Int. Cl.
*H01L 41/09* (2006.01)
*H02N 2/00* (2006.01)
(Continued)

(52) U.S. Cl.
CPC ......... *H02N 2/004* (2013.01); *H01L 41/0913* (2013.01); *H02N 2/0075* (2013.01);
(Continued)

(58) Field of Classification Search
CPC ..... H01L 41/083; H01L 41/0913; H02N 2/04; H02N 2/0075; H02N 2/026; H02N 2/103
(Continued)

(56) References Cited

U.S. PATENT DOCUMENTS 4,933,590 A * 6/1990 Inoue .................. H02N 2/0045
310/323.14
5,136,200 A * 8/1992 Takizawa .............. H02N 2/003
310/323.16
(Continued)

FOREIGN PATENT DOCUMENTS

DE    199 38 954 A1    3/2001

OTHER PUBLICATIONS

Office Action dated Mar. 20, 2018, by the European Patent Office in corresponding European Patent Application No. 15757120.9. (4 pages).
(Continued)

*Primary Examiner* — Thomas M Dougherty
(74) *Attorney, Agent, or Firm* — Buchanan Ingersoll & Rooney PC

(57) ABSTRACT

An exemplary ultrasonic motor includes an ultrasonic actuator, functioning as a waveguide resonator, formed as a rectangular piezo-electrical plate having two main surfaces and side surfaces that join the main surfaces together, an element to be driven and an electrical excitation device. At least one friction element is arranged on at least one side surface of the ultrasonic actuator and is in frictional contact with the element to be driven. The piezo-electrical plate is divided into three parts. The central part forms a generator for an acoustic longitudinal standing wave, and the peripheral parts bordering the central part form generators for an acoustic bending standing wave. Each generator is electrically connected to the electrical excitation device-can be electrically controlled, and can be divided into two equally-sized and electrically individually controllable sub-generators. Each sub-generator has layers of excitation electrodes, layers of general electrodes, and layers of piezo-ceramics arranged therebetween.

10 Claims, 15 Drawing Sheets

(51) Int. Cl.
*H01L 41/083* (2006.01)
*H01L 41/047* (2006.01)
*H02N 2/02* (2006.01)
*H02N 2/10* (2006.01)

(52) U.S. Cl.
CPC ............ *H02N 2/026* (2013.01); *H02N 2/103* (2013.01); *H01L 41/083* (2013.01)

(58) Field of Classification Search
USPC ............ 310/323.01, 323.02, 323.06, 323.09, 310/323.13, 323.16, 323.17, 323.19, 328
See application file for complete search history.

(56) References Cited

U.S. PATENT DOCUMENTS

| | | | |
|---|---|---|---|
| 5,714,833 A | 2/1998 | Zumeris | |
| 5,877,579 A | 3/1999 | Zumeris | |
| 6,806,620 B1 | 10/2004 | Wischnewskiy | |
| 7,075,211 B1* | 7/2006 | Ganor | H01L 41/0913 310/317 |
| 7,471,030 B2* | 12/2008 | Bennett | H02N 2/023 310/323.16 |
| 8,269,398 B2* | 9/2012 | Miyano | H01L 41/0471 310/323.02 |
| 8,344,592 B2* | 1/2013 | Wischnewskly | H01L 41/083 310/323.02 |
| 2006/0238072 A1 | 10/2006 | Funakubo | |
| 2008/0122316 A1 | 5/2008 | Ue et al. | |

OTHER PUBLICATIONS

International Search Report (PCT/ISA/210) dated Nov. 20, 2015, by the European Patent Office as the International Searching Authority for International Application No. PCT/DE2015/200409.

Written Opinion (PCT/ISA/237) dated Nov. 20, 2015, by the European Patent Office as the International Searching Authority for International Application No. PCT/DE2015/200409.

* cited by examiner

ULTRASONIC MOTOR

The invention relates to an ultrasonic motor according to claims 1 to 10.

An ultrasonic motor is known from U.S. Pat. No. 6,806, 620 B1 in which the acoustic bending and longitudinal standing waves are in the actuator generated by way of two separate and independent generators for these waves.

Furthermore, ultrasonic motors are known, for example from U.S. Pat. Nos. 5,877,579 and 5,714,833, in which the acoustic bending and longitudinal standing waves are in the actuators generated with one and the same generator.

In these motors known from the prior art, the acoustic bending standing wave is in the actuators generated in that the piezo-electrical plate is bent over its height or width, respectively. A correspondingly high electrical voltage is required for bending the piezo-electrical plate of the actuator over its height. With such excitation of the piezo-electrical plate, high mechanical losses arise therein. This reduces both the maximum speed of movement of the element to be driven as well as the maximum force developed by the motor, and simultaneously increases the losses in the actuator of the motor. All this together reduces the performance and efficiency of these motors.

It is therefore the object of the invention to provide an ultrasonic motor which overcomes the aforementioned drawbacks of the prior art ultrasonic motors and, accordingly, provides an ultrasonic motor with an increased maximum speed of movement and force at reduced mechanical losses.

This object is satisfied with an ultrasonic motor according to claim 1, where the subsequent dependent claims comprise at least advantageous embodiments and further developments.

According thereto, the starting point is an ultrasonic motor comprising an ultrasonic actuator functioning as a waveguide resonator in the form of a rectangular piezo-electrical plate having two main surfaces that are largest in terms of area and side surfaces that join the main surfaces to one another, an element to be driven and an electrical excitation device. The main surfaces are there arranged preferably parallel to one another, and preferably four side surfaces are present, two of which are shorter than the remaining two side surfaces.

At least one friction element is arranged on at least one side surface of the ultrasonic actuator and is in operative or frictional contact with the element to be driven.

The piezo-electrical plate is along its longitudinal direction, i.e. in the direction of the greatest extension of the piezo-electrical plate divided into three parts, where the central or middle part forms a generator for an acoustic longitudinal standing wave, and the peripheral parts bordering the central part form generators for an acoustic bending standing wave. All generators are there electrically connected to the electrical excitation device.

Each of the generators for an acoustic bending standing wave is along the thickness direction of the piezo-electrical plate, i.e. in the direction of the smallest extension of the piezo-electrical plate, divided into two equally-sized sub-generators, where each of the sub-generators is individually or separately electrically controllable, has layers of excitation electrodes, layers of general electrodes, and layers of piezo-ceramics arranged therebetween.

It can be advantageous to have the generator for the acoustic longitudinal standing wave comprise layers of excitation electrodes, layers of general electrodes and layers of piezo-ceramics arranged therebetween.

It can also be advantageous to have the generator for the acoustic longitudinal standing wave be divided along the thickness direction of the piezo-electrical plate into two equally-sized and individually or separately electrically controllable sub-generators, and each of the sub-generators comprises layers of excitation electrodes, layers of general electrodes and layers of piezo-ceramics arranged therebetween.

Furthermore, it can be advantageous that the layers of excitation electrodes and the layers of general electrodes and the layers of piezo-ceramics respectively arranged therebetween are arranged parallel to the main surfaces.

In addition, it can be advantageous to have the ratio of the length to the thickness of the ultrasonic actuator be between 9 and 11 so that the first mode of the acoustic deformation longitudinal wave and the third mode of the acoustic deformation bending wave of the same frequency can simultaneously be excited in the ultrasonic actuator.

Furthermore, it can be advantageous to have the ratio of the width to the thickness of the ultrasonic actuator be between 2 and 3.

In addition, it can be advantageous to have the piezo-ceramic layers bordering in the thickness direction be polarized in opposite directions, i.e. anti-parallel.

In addition, it can be advantageous to have the electrical excitation device provide electrical two-phase voltage of the same frequency for independent symmetrical two-phase excitation of the generator for the acoustic longitudinal standing wave and of the generators for the acoustic bending standing wave.

It can also be advantageous to have the electrical excitation device provide electrical single-phase voltage for simultaneous symmetrical excitation of the generator for the acoustic longitudinal standing wave and for the asymmetrical excitation of the generators for the acoustic bending standing wave.

Finally, it can be advantageous to have the electrical excitation device provide electrical single-phase voltage for simultaneous asymmetrical excitation of the generator for the acoustic longitudinal standing wave and for the asymmetrical excitation of the generators for the acoustic bending standing wave.

Shown schematically and not to scale by:

Figure 6:
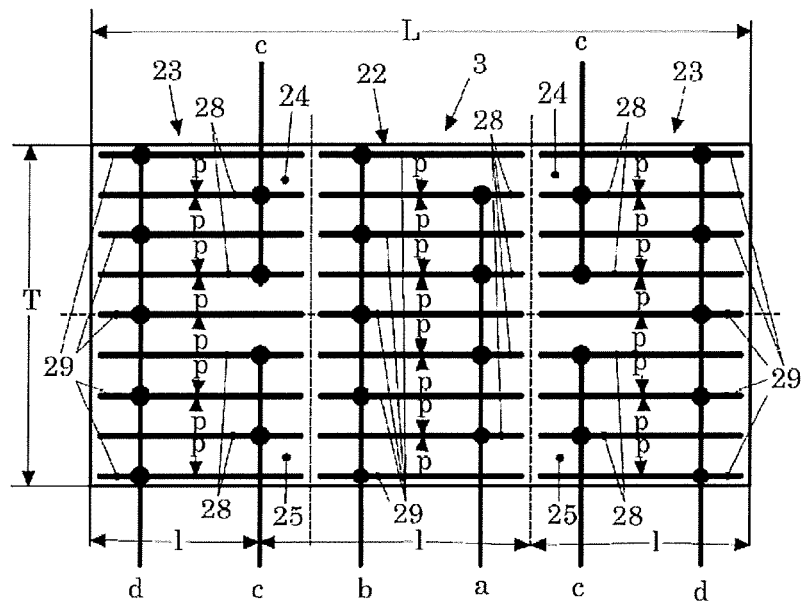
FIG. 6 is the representation of an option for electrically connecting the electrodes of the generators of the actuator of an ultrasonic motor according to the invention when using a two-phase excitation device.
Figure 6:
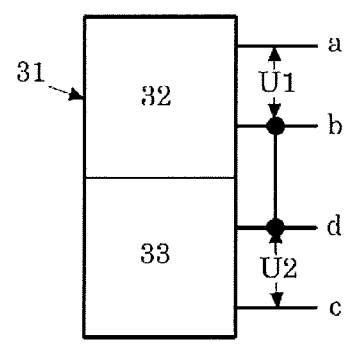
Figure 7:
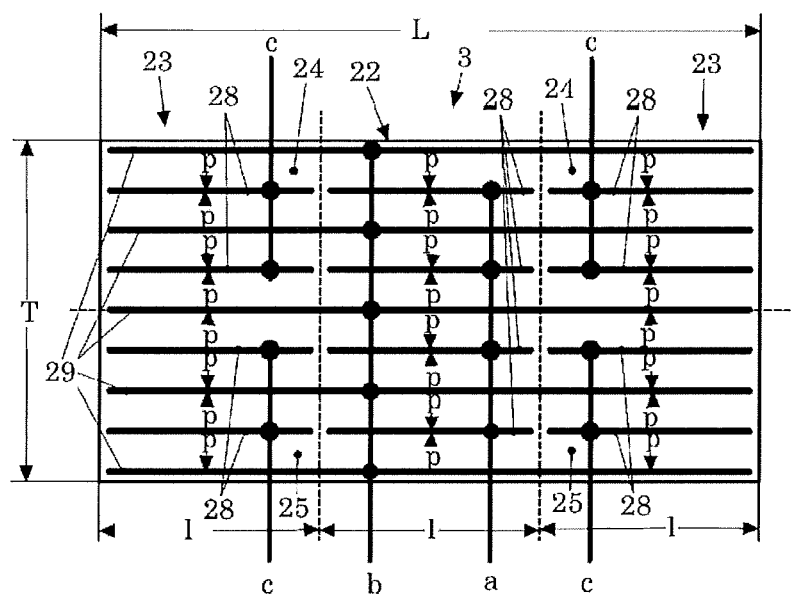
FIG. 7 is the representation of a further option for electrically connecting the electrodes of the generators of the actuator of an ultrasonic motor according to the invention when using a two-phase excitation device.
Figure 7:
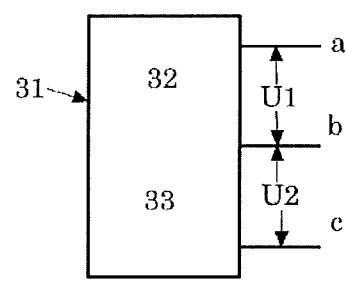
Figure 8:
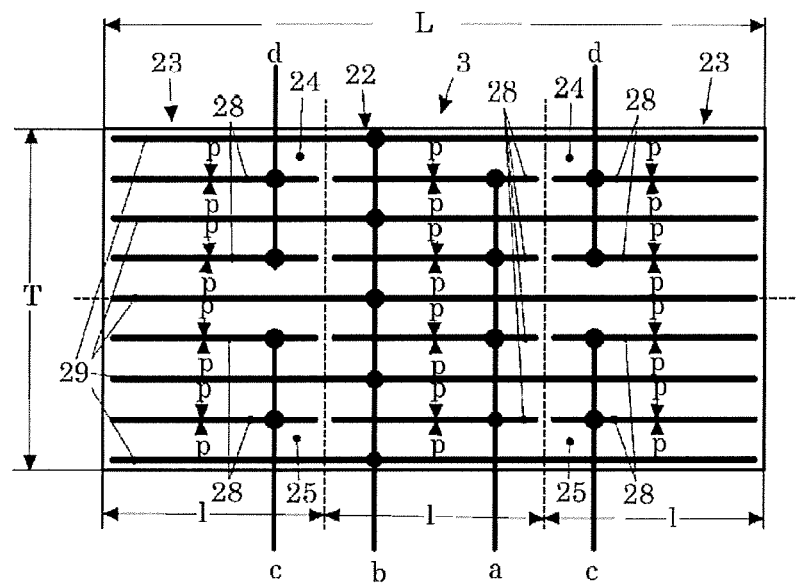
FIG. 8 is the representation of an option for electrically connecting the electrodes of the generators of the actuator of an ultrasonic motor according to the invention when using a single-phase excitation device.
Figure 8:
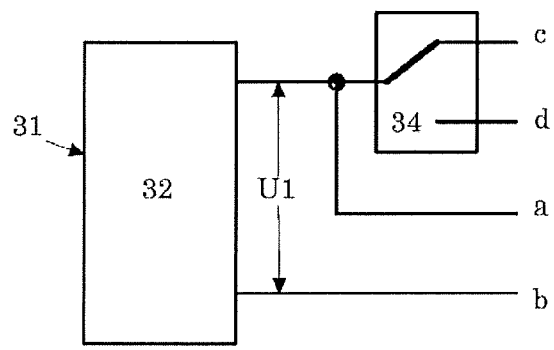
Figure 9:
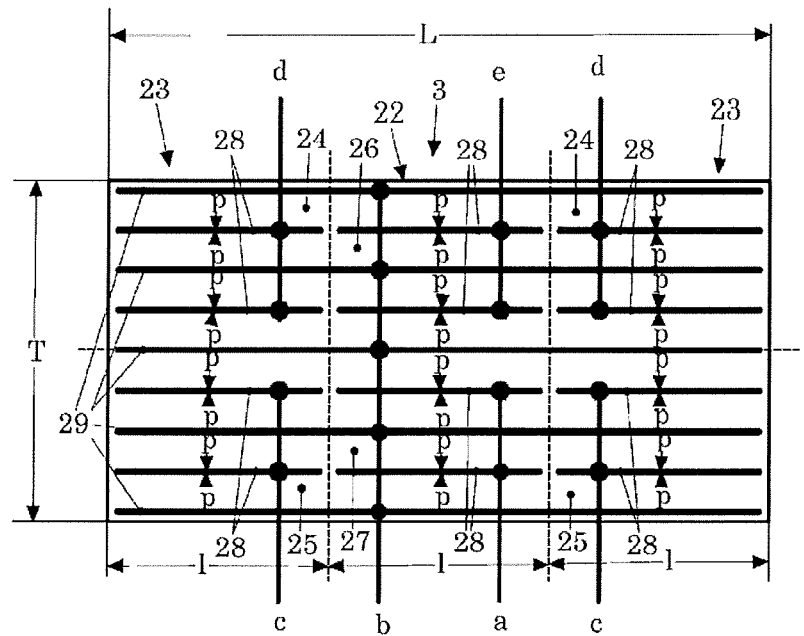
FIG. 9 is the representation of a further option for electrically connecting the electrodes of the generators of the actuator of an ultrasonic motor according to the invention when using a single-phase excitation device.
Figure 9:
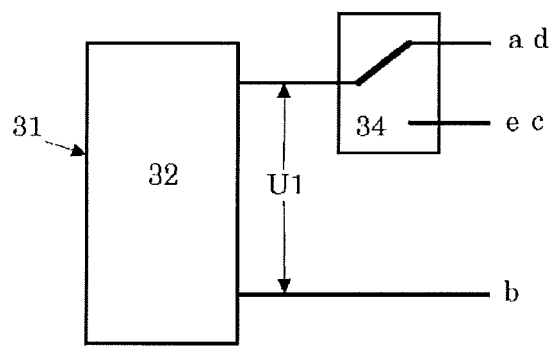
Figure 10:
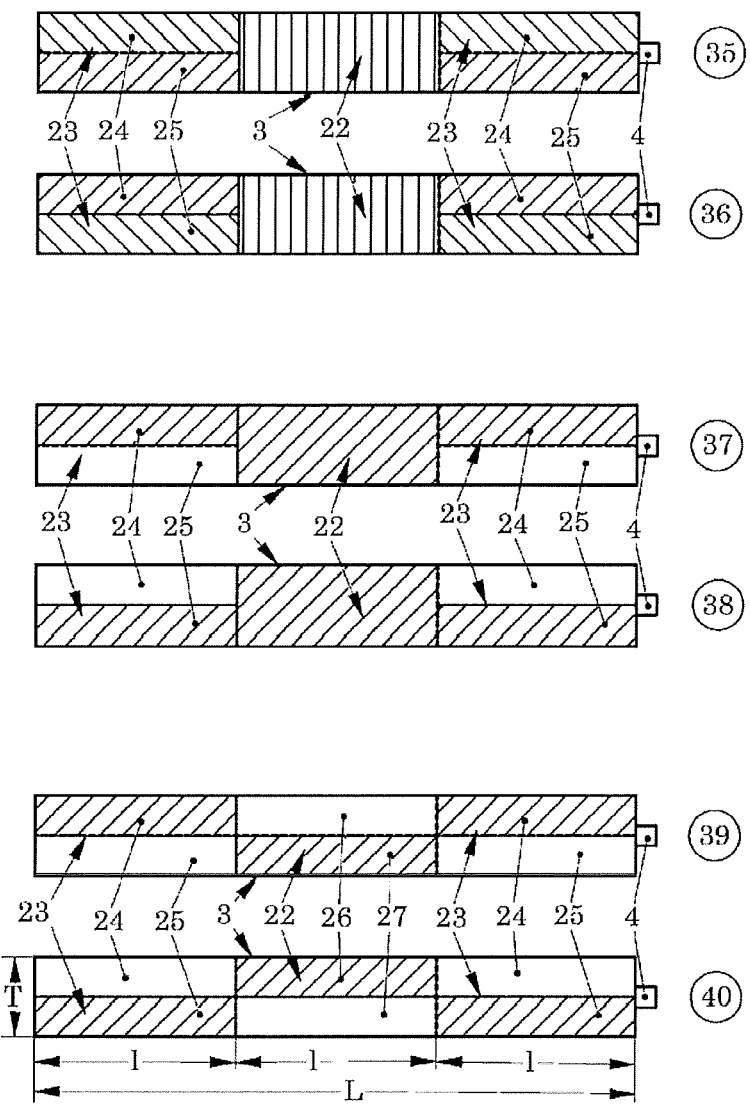
Figure 11:
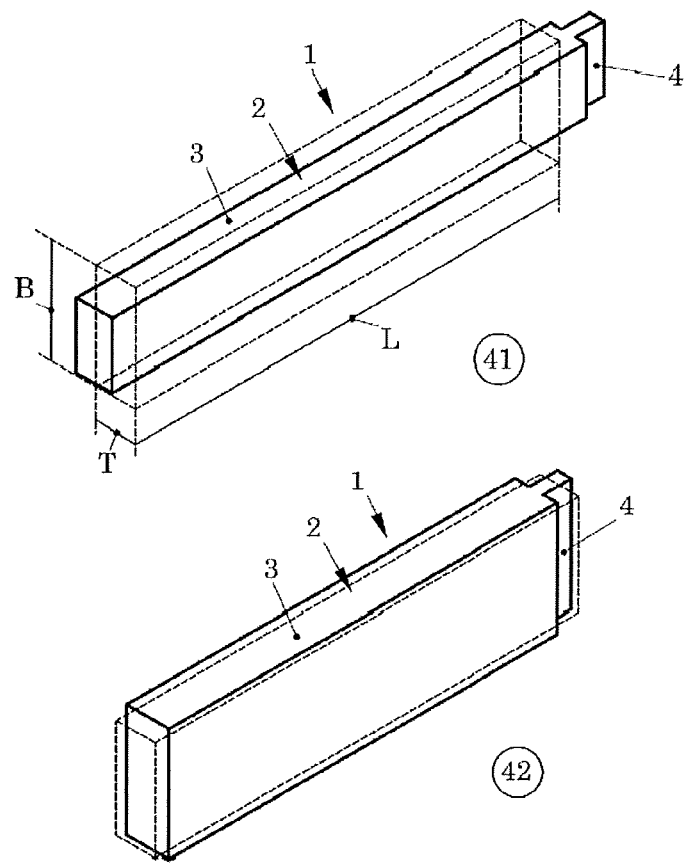
Figure 12:
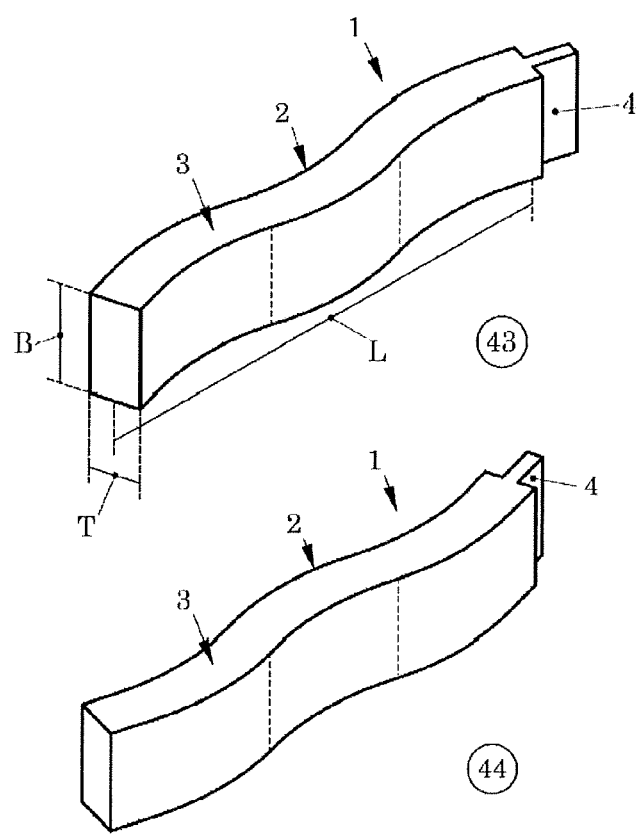
Figure 13:
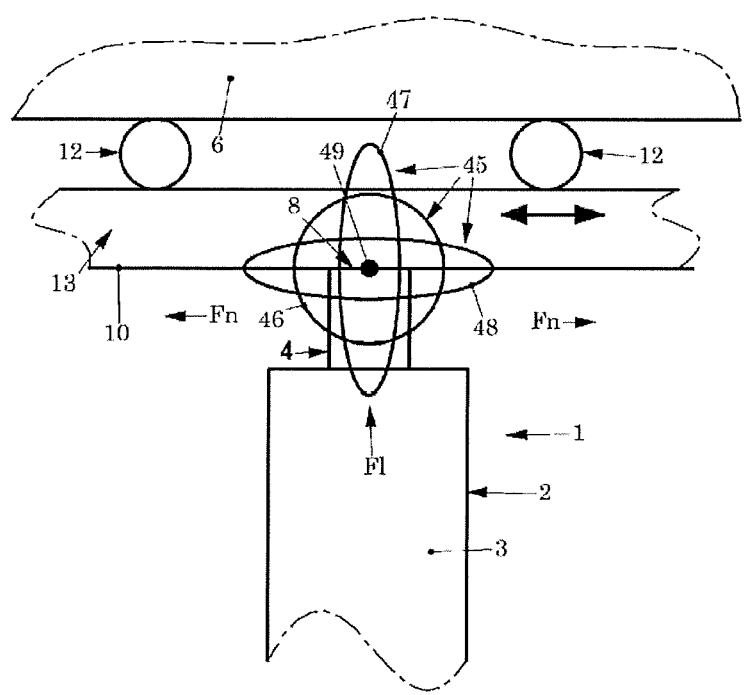
Figure 14:
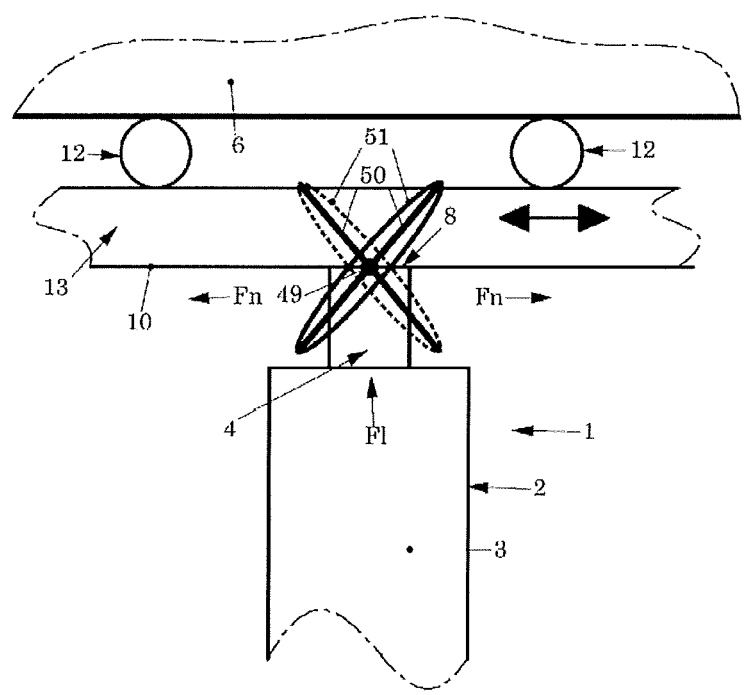
Figure 15:
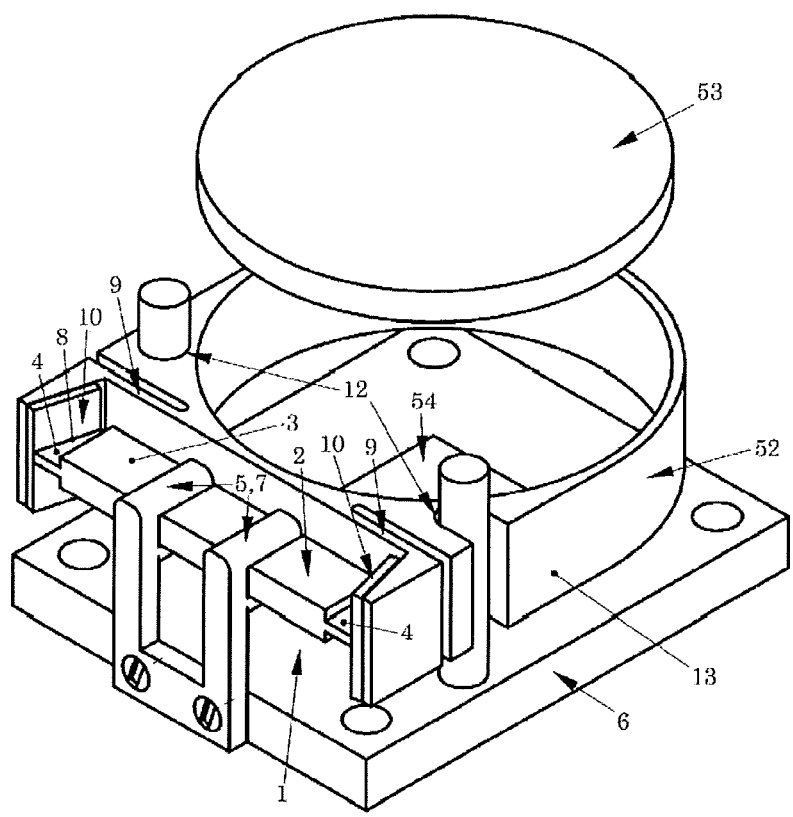

FIG. 10 are representations 35 and 36: electrically excited regions of the ultrasonic actuator of an ultrasonic motor according to the invention with a circuit according to FIG. 6 and FIG. 7; representations 37 and 38: electrically excited regions of the ultrasonic actuator of an ultrasonic motor according to the invention with a circuit according to FIG. 8; representations 39 and 40: electrically excited regions of the ultrasonic actuator of an ultrasonic motor according to the invention with a circuit according to FIG. 9;

FIG. 11 are representations 41 and 42: phases of the maximum deformation of the longitudinal standing wave generated in the actuator of an ultrasonic motor according to the invention;

FIG. 12 are representations 43 and 44: phases of the maximum deformation of the bending standing wave generated in the actuator of an ultrasonic motor according to the invention;

FIG. 13 is a representation of possible trajectories of a point on the friction element of an actuator of an ultrasonic motor according to the invention with a two-phase excitation;

FIG. 14 is a representation of possible trajectories of a point on the friction element of an actuator of an ultrasonic motor according to the invention with a single-phase excitation;

FIG. 15 is a possible embodiment of the ultrasonic motor according to the invention as a drive of a lens in a microobjective.

Figure 1:
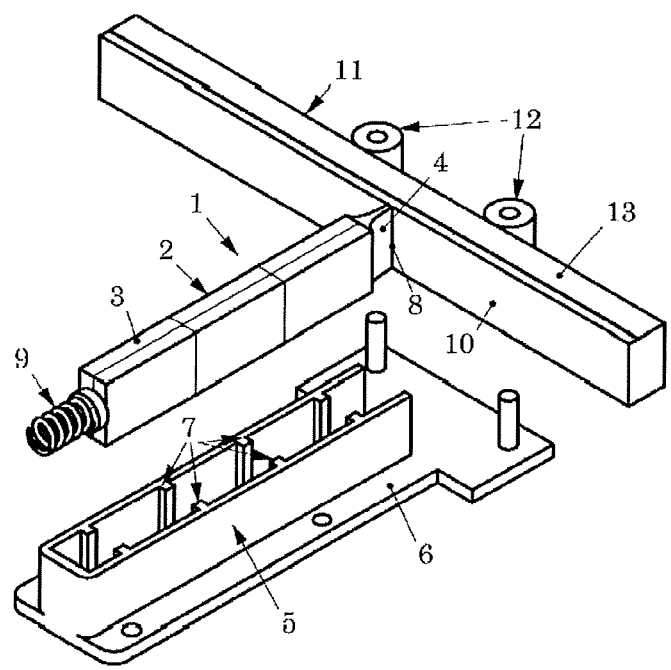
FIG. 1 is an embodiment of the ultrasonic motor according to the invention.

According to FIG. 1, the optional embodiment of a linear ultrasonic motor according to the invention shown there comprises a rectangular ultrasonic actuator 1, which at the same time functions as a waveguide resonator 2 for an acoustic standing wave, in the form of a piezo-electrical plate 3 with a friction element 4 arranged on its face surfaces. The ultrasonic actuator there comprises two oppositely disposed face surfaces running parallel to one another, where the face surfaces are formed by the side surfaces of the ultrasonic actuator which are smallest in terms of area. The friction element is in mechanical (frictional) contact with a friction layer 10 which is arranged on an element 11 to be driven in the form of a rod 13 such that it completely covers the respective side surface of the element to be driven. The cross-sectional area of the friction element tapers in the direction of the friction layer staring out from the contact surface between the piezo-electrical plate and the friction element. The element to be driven is linearly movably supported by two ball bearings 12.

Ultrasonic actuator 1 is arranged in support 5 of casing 6 such that it can be displaced along guide rails 7. Friction element 4 is with its friction surface 8 with the aid of spring 9 pressed against friction layer 10 of element 11 to be driven.

Figure 2:
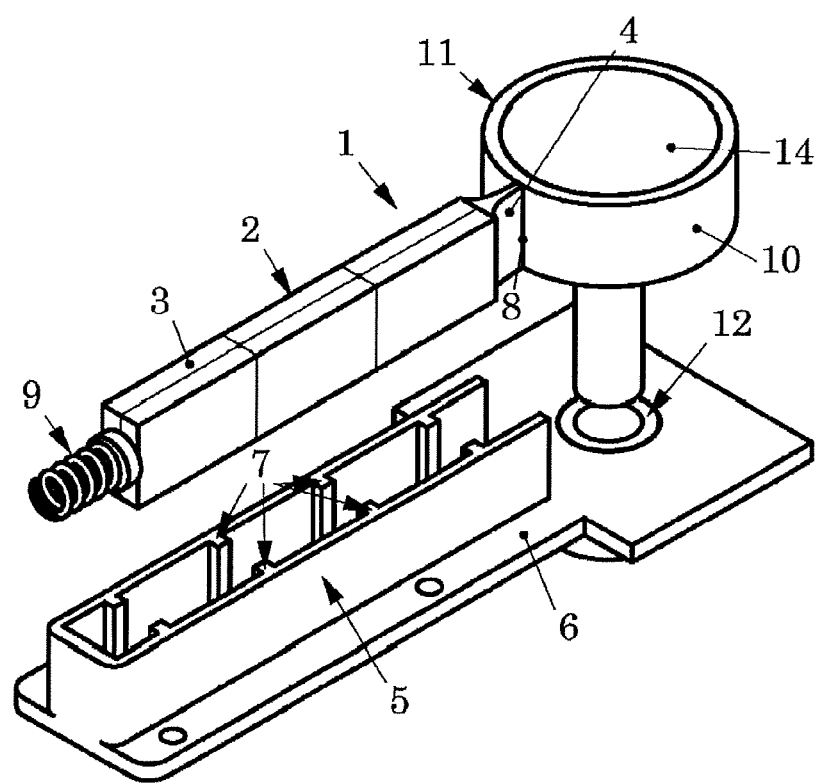
FIG. 2 is a further embodiment of the ultrasonic motor according to the invention.

FIG. 2 shows an embodiment of a rotary ultrasonic motor according to the invention which differs slightly from the design of the linear ultrasonic motor according to FIG. 1, for which reason only the respective differences shall be discussed hereafter.

Element 11 to be driven there has the shape of a round disc and constitutes a rotor 14, on the outer circumferential surface of which friction layer 10 is arranged. A shaft arranged on the rotor and connected thereto is rotatably supported by ball bearing 12.

Figure 3:
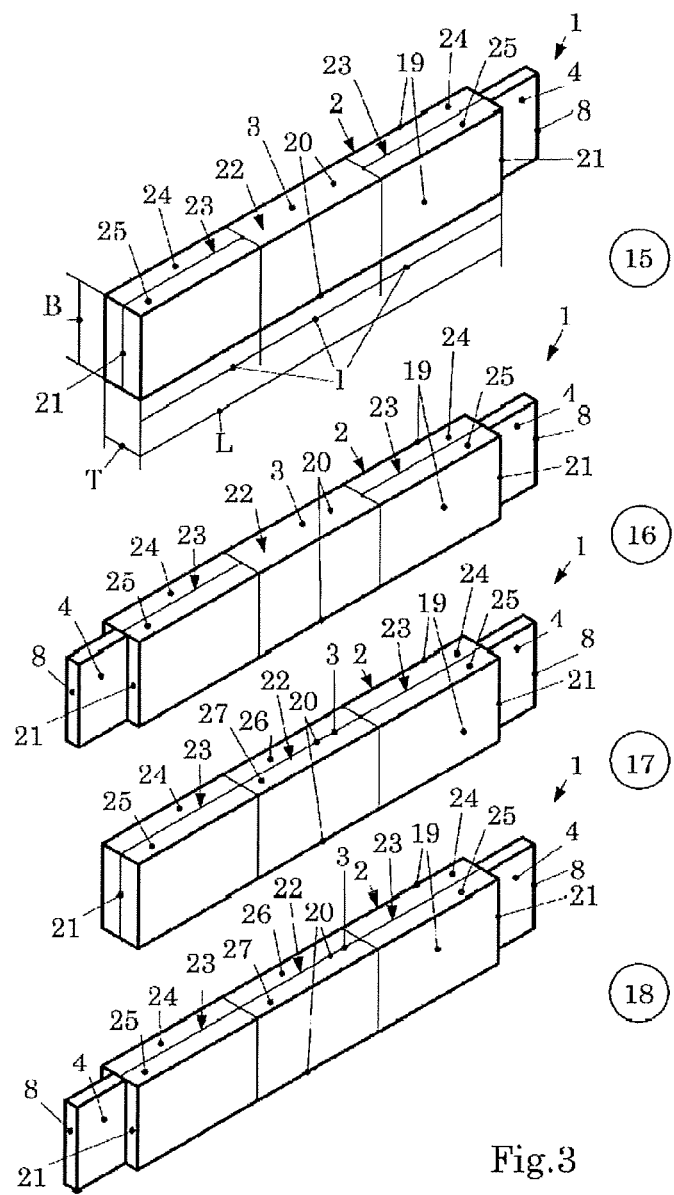
FIG. 3 are representations 15 to 18: Different embodiments of the actuator of an ultrasonic motor according to the invention.

Representations 15 to 18 of FIG. 3 show different embodiments for an ultrasonic actuator 1 of the ultrasonic motor according to the invention. Each of the ultrasonic actuators shown there comprises two main surfaces 19 that are largest in terms of area, two long side surfaces 20 and two short side surfaces forming face surfaces 21. Furthermore, each of the ultrasonic actuators shown in representations 15 to 18 has a length L, a width B, and a thickness T.

Each of the ultrasonic actuators shown in representations 15 to 18 is along its length divided into three parts of length I, where the central part forms a generator 22 for an acoustic longitudinal standing wave and the peripheral parts bordering the central part form generators 23 for an acoustic bending standing wave.

In the ultrasonic actuators according to representations 15 and 16, generators 23 for an acoustic bending standing wave are along the thickness direction of the piezo-electrical plate or ultrasonic actuator, respectively, divided into two equally-sized and electrically individually controllable sub-generators 24 and 25, where the sub-generators comprise layers of excitation electrodes, layers of general electrodes and layers of piezo-ceramics arranged therebetween, where the general electrodes and the excitation electrodes of each sub-generator are connected to the electrical excitation device.

In the ultrasonic actuators according to representations 17 and 18, in addition to generators 23 for an acoustic bending standing wave, also the respective generator for an acoustic longitudinal standing wave 22 is along the thickness direction of the piezo-electrical plate or ultrasonic actuator, respectively, divided into two equally-sized and electrically individually controllable generator parts 26 and 27, where each generator part comprises layers of excitation electrodes, layers of general electrodes and layers of piezoceramics arranged therebetween, and the general electrodes and the excitation electrodes of each generator part are connected to the electrical excitation device.

While a friction element 4 is in the ultrasonic actuators according to representations 15 and 17 arranged only on one of the two face surfaces 21, a friction element 4 is in the ultrasonic actuators according to representations 16 and 18 respectively located on both face surfaces 21. In all cases, friction element 4 has a rectangular shape with a friction surface 8 at its free end.

Length L of piezo-electrical plate 1 is in a general manner chosen for the ultrasonic actuator of the ultrasonic motor according to the invention such that it is approximately equal to half the wavelength $\lambda_1$ of the acoustic longitudinal deformation wave propagating along length L in waveguide resonator 2 with the frequency $f_a$ such that the first mode of an acoustic longitudinal standing wave forms in piezoelectrical plate 3.

The frequency $f_a$ can be determined from the formula $f_a = N/L$, where N depends on the type of piezo-ceramic material. For the piezo-ceramic material PIC 181 of PI Ceramic GmbH Ceramic Technologies and Components, Lederhose (Thuringia), N=1278 Hzm.

Furthermore, thickness T of piezo-electrical plate 3 of ultrasonic actuator 1 is selected such that an acoustic deformation standing wave having the same frequency $f_a$ propagates in piezo-electrical plate 3 at length L so that the third mode of an acoustic bending standing wave forms in piezoelectrical plate 3.

Thickness T of piezo-electrical plate 3 can be approximately determined from the formula T=L/k where k=L/T is in the range between 9 and 11. Width B of piezo-electrical plate 3 can range from 2T to 3T.

Figure 4:
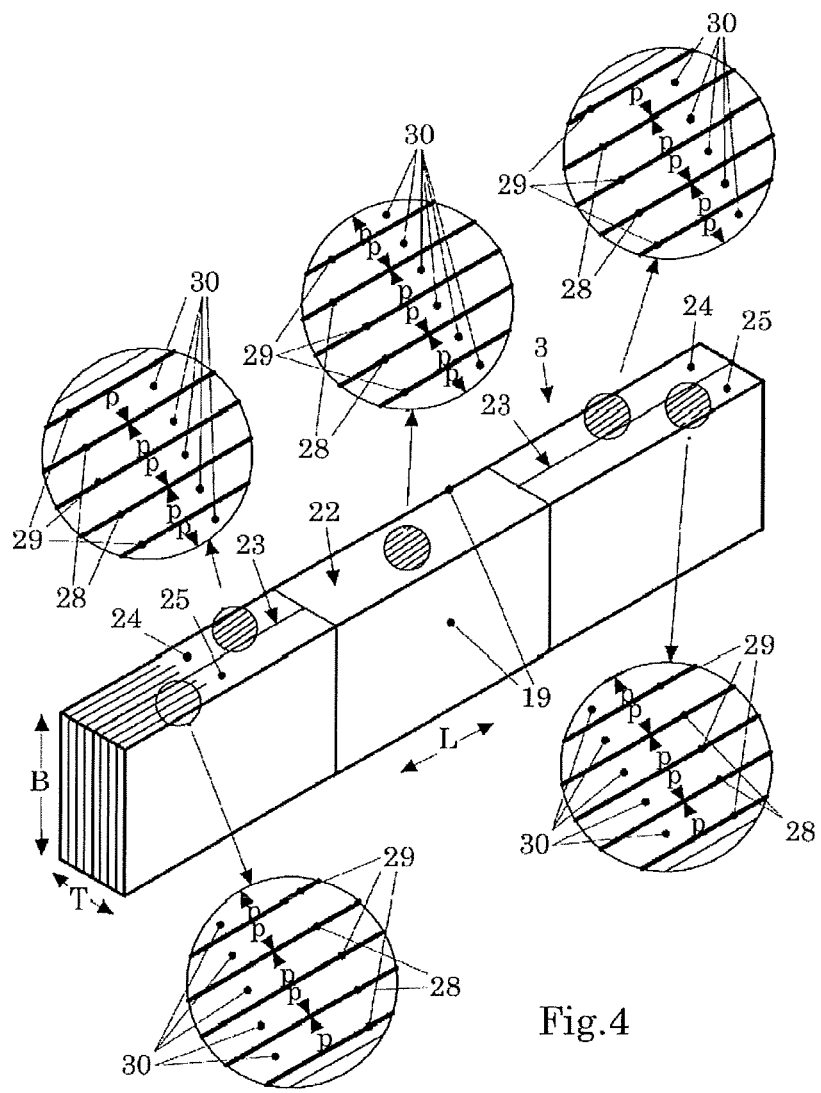
FIG. 4 is an embodiment of the actuator of an ultrasonic motor according to the invention.
Figure 5:
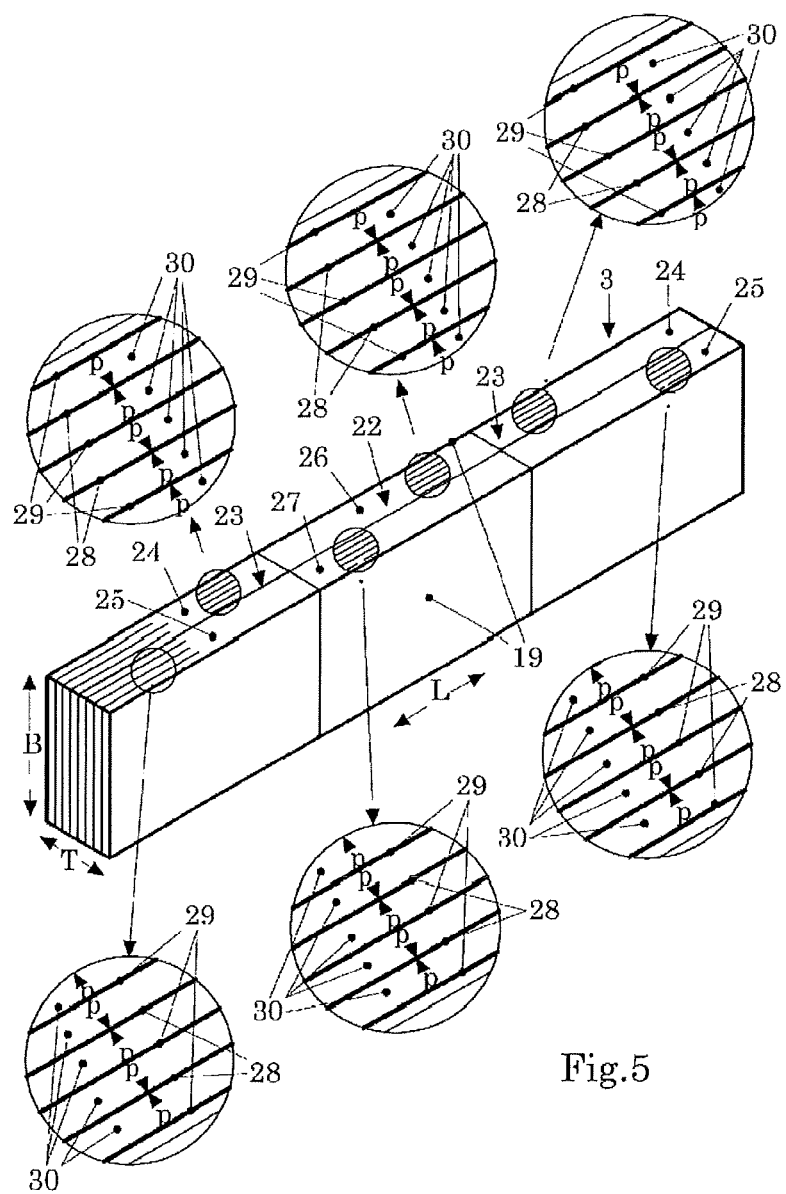
FIG. 5 is a further embodiment of the actuator of an ultrasonic motor according to the invention.

FIG. 4 shows a possible internal configuration of piezoelectrical plate 3 or of ultrasonic actuator 1 according to representations 15 and 16 of FIG. 3, whereas FIG. 5 shows a possible internal configuration of piezo-electrical plate 3 or ultrasonic actuator 1 according to representations 17 or 18 of FIG. 3. Generators 22 and 23 of piezo-electrical plate 3 comprise excitation electrodes 28, general electrodes 29 and piezo-ceramic layers 30 respectively arranged therebetween. Both the excitation electrodes as well the general electrodes are there arranged parallel to the main surfaces of the ultrasonic actuator or the piezo-electrical plate, respectively. Adjacent piezo-ceramic layers 30 are polarized in opposite directions, where the polarization direction is respectively perpendicular to electrodes 28 and 29. The polarization direction is in FIG. 4 respectively indicated by an arrow having the index p.

FIG. 6 shows an option for the electrical connection of the electrodes of the generators of an ultrasonic actuator of an ultrasonic motor of the invention according to FIG. 5 when using a two-phase excitation device for the symmetrical two-phase excitation of generators 22 and 23. The bordering piezo-ceramic layers 29 of generator parts 24 and 25 there have the same polarization direction. It is possible that the polarization direction of piezo-ceramic layers 30 in sub-generators 24—relative to piezo-ceramic layers 30 in sub-generators 25—differs. Likewise, it is possible that the polarization direction of piezo-ceramic layers 30 in sub-generators 26—relative to piezo-ceramic layers 30 in sub-generators 25—differs.

FIG. 6 also shows a block diagram relating to the connection of electrodes 28 and 29 of generators 22 and 23 of piezo-electrical plate 3 to an electrical two-phase excitation device 31.

The electrical two-phase excitation device 31 there consists of the generators for the electrical voltages 32 and 33. These generators provide the electrical alternating voltages U1 and U2 at the same frequency $f_a$ which are phase-shifted relative to each other by the angle φ.

Voltage U1 is via terminals a, b applied to electrodes 28, 29 of generators 22, whereas voltage U2 is via the terminals d, c applied to electrodes 28, 29 of generators 23.

FIG. 7 shows a further option for the electrical connection of the electrodes of the generators of an ultrasonic actuator of an ultrasonic motor of the invention according to FIG. 5 when using a two-phase excitation device for symmetrical two-phase excitation of generators 22 and 23.

FIG. 7 further shows a block diagram relating to the connection of electrodes 28 and 29 of generators 22 and 23 to electrical two-phase excitation device 3 of piezo-electrical plate 31. General electrodes 29 are there connected to one another.

FIG. 8 shows an option for the electrical connection of the electrodes of the generators of an ultrasonic actuator of an ultrasonic motor of the invention according to FIG. 5 when using a single-phase excitation device. FIG. 8 further shows a block diagram relating to the connection of electrodes 28 and 29 of generators 22 and 23 of the ultrasonic actuator to electrical excitation device 31.

Electrical excitation device 31 there consists of generator 32 providing electrical alternating voltage U1. This voltage is via terminals a and b applied to electrodes 28 and 29 of generator 22 and via changeover switch 34 and terminals c to electrodes 28 and 29 of sub-generators 24 of generators 23, or terminals d are via changeover switch 34 connected to electrodes 28 and 29 of sub-generators 25 of generators 23.

The electric circuit shown in FIG. 8 realizes the symmetrical excitation of generator 22 and the asymmetrical excitation of generators 23.

FIG. 9 shows a further option for the electrical connection of the electrodes of the generators of an ultrasonic actuator of an ultrasonic motor of the invention according to FIG. 5 when using a single-phase excitation device. In addition, FIG. 9 also shows a corresponding block diagram relating to the connection of electrodes 28 and 29 of generators 22 and 23 of the ultrasonic actuator to electrical excitation device 31.

Voltage U1 is there via the change-over switch 34 and terminals a, d applied to electrodes 28 and 29 of sub-generators 24 of generators 23 and to electrodes 28 and 29 of sub-generator 27 of generator 22. It is also possible to apply voltage U1 via change-over switch 34 and terminals e, c to electrodes 28 and 29 of sub-generators 25 of generators 23 and to electrodes 28 and 29 of sub-generator 27 of generator 22.

The electric circuit shown in FIG. 9 enables the asymmetrical excitation of generator 22 and the asymmetrical excitation of generators 23.

Representations 35 and 36 of FIG. 10 illustrate the electrically excited regions of the ultrasonic actuator or the generators or the sub-generators of an ultrasonic motor according to the invention when using an electrical circuit according to FIG. 6 and FIG. 7. Voltage U1 is applied to generator 22, while voltage U2 is applied to generators 23. Since sub-generators 24 and 25 or the corresponding piezo-electric material, respectively, have or has different polarization directions, the hatching is different there although the same electrical potential is present in the different generator parts.

Representations 37 and 38 illustrate the electrically excited regions of the ultrasonic actuator or the generators or the sub-generators of an ultrasonic motor according to the invention when using an electrical circuit according to FIG. 8. Voltage U1 is applied to both generator 22 as well as to respective sub-generators 24 and 25 of generators 23.

Finally, representations 39 and 40 illustrate the electrically excited regions of the ultrasonic actuator or the generators or the sub-generators of an ultrasonic motor according to the invention when using an electrical circuit according to FIG. 9.

Representations 41 and 42 of FIG. 11 show the phases of the maximum deformation of the longitudinal standing wave generated in the actuator of an ultrasonic motor according to the invention, while representations 43 and 44 show the phases of the maximum deformation of the bending standing wave generated in the actuator of an ultrasonic motor according to the invention.

With two-phase excitation of ultrasonic actuator 1 by voltages U1 and U2 according to FIGS. 6 and 7 with frequency $f_a$, the two above-described standing waves are simultaneously generated in piezo-electrical plate 3, i.e. one longitudinal standing wave and one bending standing wave. Due to the superposition of these waves, friction element 4 according to FIG. 11 moves on a closed trajectory 45 which can for point 49 located on friction surface 8 of friction element 4 have the shape of a circle 46 or the shape of an ellipse 47 or 48, respectively.

The shape of trajectory 45 and its inclination relative to friction layer 10 of element 11 to be driven is determined by the ratio of the amplitude of voltages U1 and U2 and the value of the phase shift angle between these voltages.

With single-phase excitation of ultrasonic actuator 1 by voltage U1 according to FIGS. 8 and 9 with frequency $f_a$, the shape of the trajectory of friction element 4 and point 49 on its friction surface is determined by the value k in the above-mentioned limits. The trajectory illustrated in FIG. 14 can there take the shape of an inclined line 50 or the shape of a narrow ellipse 51.

As a result of the acoustic longitudinal standing wave, the longitudinal force $F_l$ is formed which presses friction surface 8 of friction element 4 against friction layer 10 of element 11 to be driven. This force determines the frictional force between friction element 4 and friction layer 10 of element 11 to be driven.

Due to the acoustic bending standing wave, the transverse force $F_n$ arises which causes a motion of element 11 to be driven. This force arises by bending piezo-electrical plate 3 of ultrasonic actuator 1 over its thickness T.

Thickness T of the piezo-electrical plate is in the motor according to the invention considerably smaller than the height of the piezo-electrical plate in previously known ultrasonic motors. This is owed to the number of acoustic halfwaves generated in piezo-electrical plate 3 due to the formation of the first mode of the longitudinal standing wave and the third mode of the bending standing wave.

Substantially less electrical energy is required for generating a bending standing wave in ultrasonic actuator 1 of the ultrasonic motor according to the invention. Therefore, the ultrasonic motor according to the invention operates much more effectively than, for example, the ultrasonic motors known from patent specifications U.S. Pat. Nos. 5,877,579, 5,714,833 and 6,806,620 B1. The ultrasonic motor according to the invention requires less electrical energy, whereby smaller mechanical losses occur at higher speeds of the movement of the element to be driven. At the same time, the motor allows for higher motion forces.

FIG. 15 shows a possible embodiment of the ultrasonic motor according to the invention as a drive for a lens 53 in a micro-objective 52 for focusing the image of an optical encoder 54.

The invention claimed is:

1. Ultrasonic motor comprising an ultrasonic actuator, functioning as a waveguide resonator, in the form of a rectangular piezo-electrical plate having two main surfaces that are largest in terms of area and side surfaces that join said main surfaces to one another, an element to be driven and an electrical excitation device, wherein at least one friction element is arranged on at least one side surface of said ultrasonic actuator and is in frictional contact with said element to be driven, and said piezo-electrical plate is along its longitudinal direction divided into three parts, wherein the central part forms a generator for an acoustic longitudinal standing wave, and the peripheral parts bordering said central part form generators for an acoustic bending standing wave, and each of said generators is electrically connected to said electrical excitation device and can be electrically controlled, wherein each of said generators for an acoustic bending standing wave is divided, along the thickness direction of said piezo-electrical plate into two equally-sized and electrically individually controllable sub-generators, said sub-generators each having layers of excitation electrodes, and layers of general electrodes, and layers of piezo-ceramics arranged therebetween.

2. Ultrasonic motor according to claim 1, wherein said generator for said acoustic longitudinal standing wave comprises layers of excitation electrodes and layers of general electrodes and layers of piezo-ceramics arranged therebetween.

3. Ultrasonic motor according to claim 1, wherein said generator for said acoustic longitudinal standing wave is along the thickness direction of said piezo-electric plate divided into two equally-sized and electrically individually controllable sub-generators, and said sub-generators comprise layers of excitation electrodes, layers of general electrodes and layers of piezo-ceramics arranged therebetween.

4. Ultrasonic motor according to claim 1, wherein said layers of excitation electrodes and said layers of general electrodes and said layers of piezo-ceramics respectively arranged therebetween are arranged parallel to said main surfaces.

5. Ultrasonic motor according to claim 1, wherein the ratio of the length to the thickness of said ultrasonic actuator is between 9 and 11, so that the first mode of the acoustic deformation longitudinal wave and the third mode of the acoustic deformation bending wave of the same frequency can simultaneously be excited in said ultrasonic actuator.

6. Ultrasonic motor according to claim 1, wherein the ratio of the width to the thickness of said ultrasonic actuator is between 2 and 3.

7. Ultrasonic motor according to claim 1, wherein said piezo-ceramic layers, bordering one another when viewed in the thickness direction of said piezo-electric plate of said ultrasonic actuator, are polarized in the opposite direction.

8. Ultrasonic motor according to claim 1, wherein said electrical excitation device provides electrical two-phase voltage of the same frequency for the independent symmetrical two-phase excitation of said generator for said acoustic longitudinal standing wave and said generators for said acoustic bending wave.

9. Ultrasonic motor according to claim 1, wherein said electrical excitation device provides electrical single-phase voltage for the simultaneous symmetrical excitation of said generator for said acoustic longitudinal standing wave and for the asymmetrical excitation of said generators for said acoustic bending standing wave.

10. Ultrasonic motor according to claim 1, wherein said electrical excitation device provides electrical single-phase voltage for the simultaneous asymmetrical excitation of said generator of said acoustic longitudinal standing wave and for the asymmetrical excitation of said generators for the acoustic bending standing wave.

\* \* \* \* \*